United States Patent
Egorov et al.

(10) Patent No.: US 6,898,780 B2
(45) Date of Patent: May 24, 2005

(54) METHOD AND SYSTEM FOR CONSTRUCTING A HIERARCHY-DRIVEN CHIP COVERING FOR OPTICAL PROXIMITY CORRECTION

(75) Inventors: Evgueny E. Egorov, Moscow (RU); Stanislav V. Aleshin, Moscow (RU); Ranko Scepanovic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/327,314

(22) Filed: Dec. 20, 2002

(65) Prior Publication Data

US 2004/0123266 A1 Jun. 24, 2004

(51) Int. Cl.⁷ ............................................... G06F 17/50
(52) U.S. Cl. ............................ 716/21; 716/19; 716/20
(58) Field of Search ............................ 716/19–21, 3–5; 430/5; 250/492.22

(56) References Cited

U.S. PATENT DOCUMENTS

| | | | | |
|---|---|---|---|---|
| 5,740,068 A | * | 4/1998 | Liebmann et al. | 716/21 |
| 6,350,992 B1 | * | 2/2002 | Manabe et al. | 250/492.22 |
| 6,416,907 B1 | * | 7/2002 | Winder et al. | 430/5 |
| 6,601,231 B2 | * | 7/2003 | LaCour | 716/21 |
| 6,620,561 B2 | * | 9/2003 | Winder et al. | 430/5 |
| 2002/0100005 A1 | * | 7/2002 | Anderson et al. | 716/5 |
| 2002/0155357 A1 | * | 10/2002 | LaCour | 430/5 |
| 2002/0157068 A1 | * | 10/2002 | LaCour et al. | 716/3 |
| 2003/0014731 A1 | * | 1/2003 | LaCour | 716/21 |
| 2003/0145292 A1 | * | 7/2003 | Stine et al. | 716/4 |
| 2003/0208742 A1 | * | 11/2003 | LaCour | 716/21 |

OTHER PUBLICATIONS

"Optical Proximity Correction Driven Hierarchy" Filed Mar. 14, 2002 U.S Appl. No. 10/097,419 Aleshin et al.

* cited by examiner

Primary Examiner—Vuthe Siek
Assistant Examiner—Naum B Levin
(74) Attorney, Agent, or Firm—Sawyer Law Group

(57) ABSTRACT

A method and system for performing optical proximity correction (OPC) on an integrated circuit (IC) chip design is disclosed. The system and method of the present invention includes exploding calls on an element list to generate an expanded element list, defining a local cover area for each call on the expanded element list, classifying congruent local cover areas into corresponding groups, and performing an OPC procedure for one local cover area in each group By defining the local cover area for each call and grouping congruent local cover areas, only one OPC procedure (e.g., evaluation and correction) needs to be performed per group of congruent local cover areas. The amount of data to be evaluated and the number of corrections performed is greatly reduced because OPC is not performed on repetitive portions of the IC chip design, thereby resulting in significant savings in computing resources and time.

25 Claims, 4 Drawing Sheets

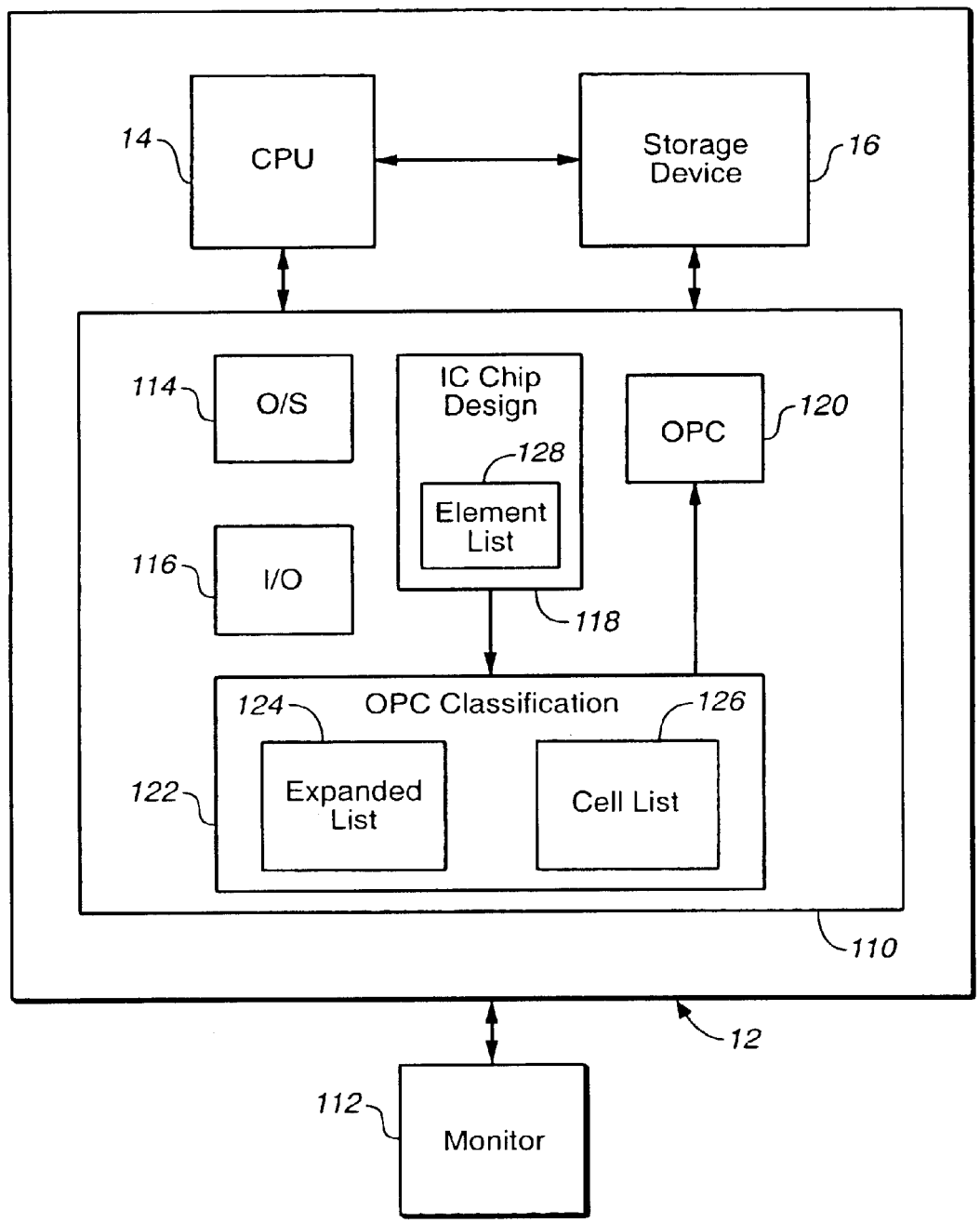
FIG._1

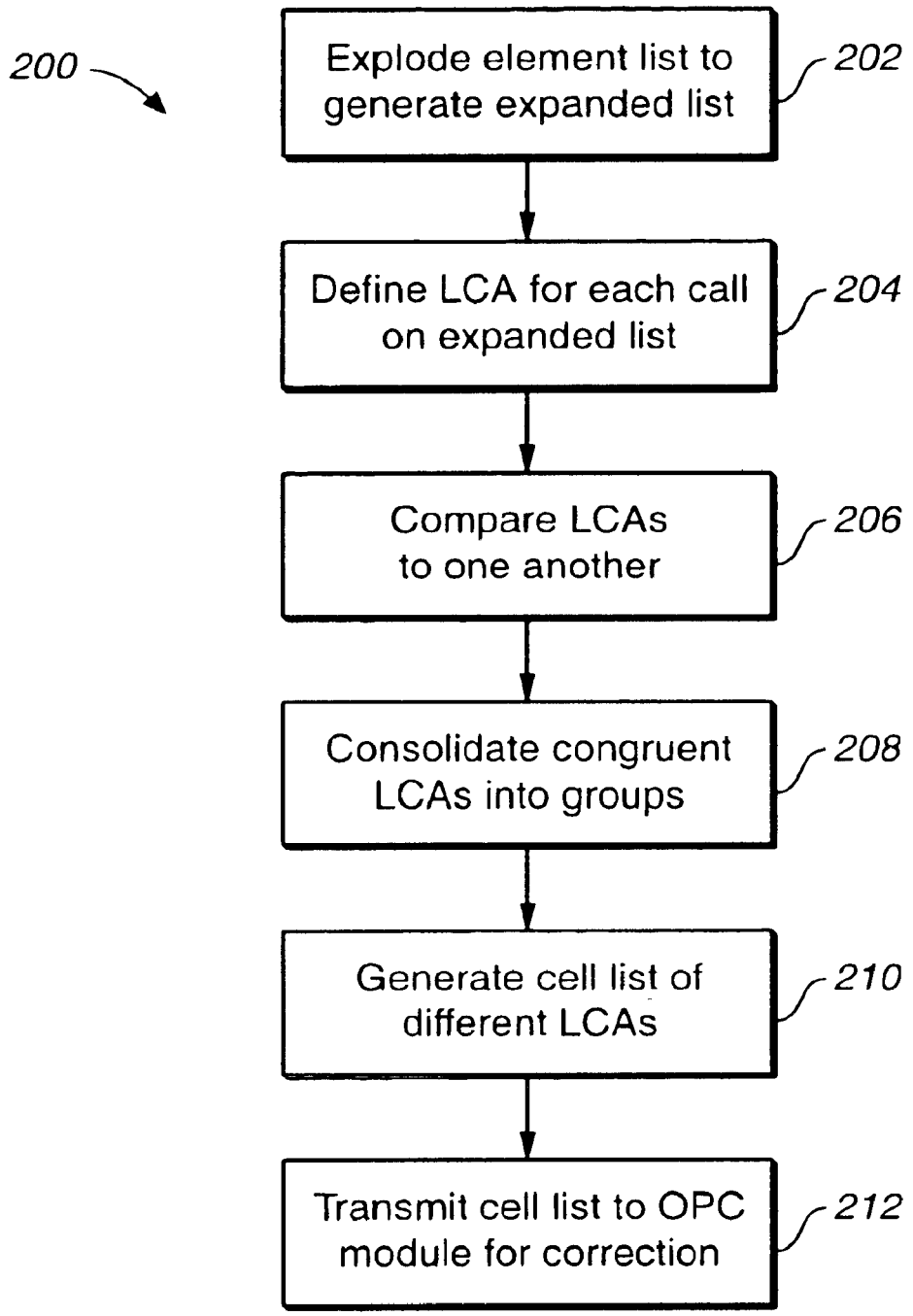
FIG._2

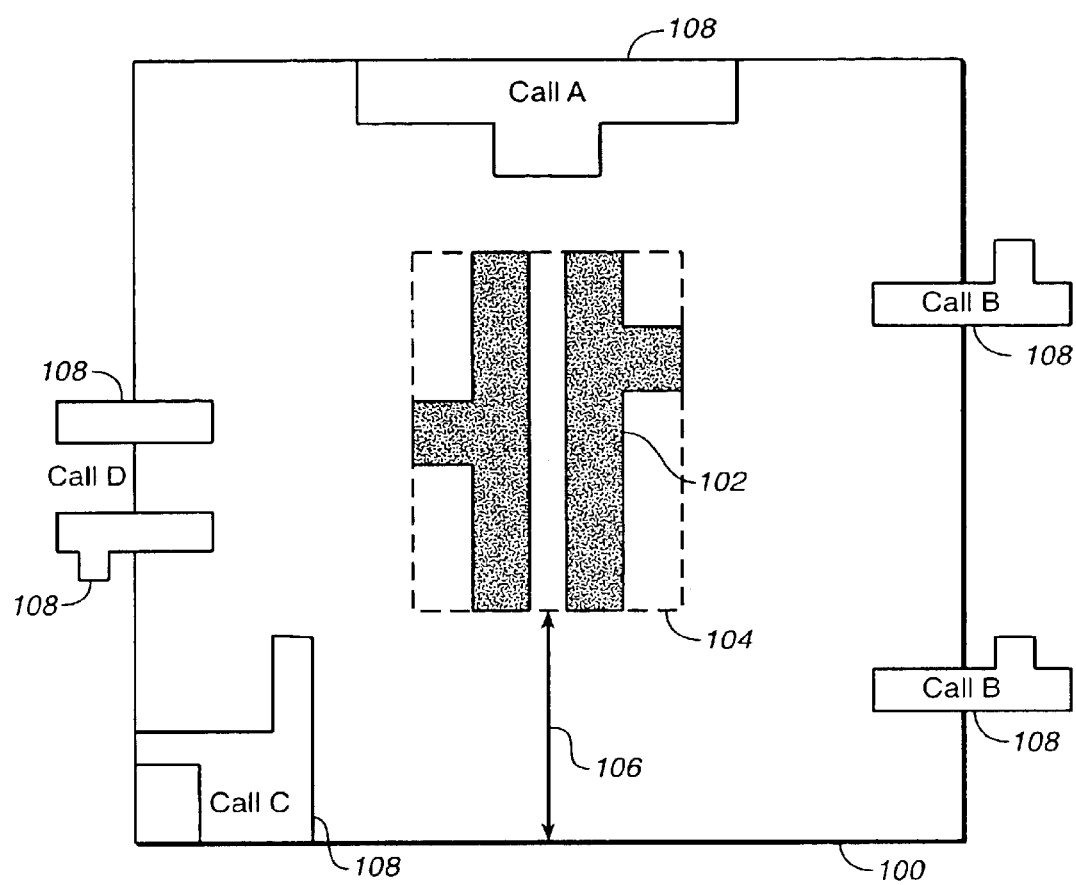
FIG._3

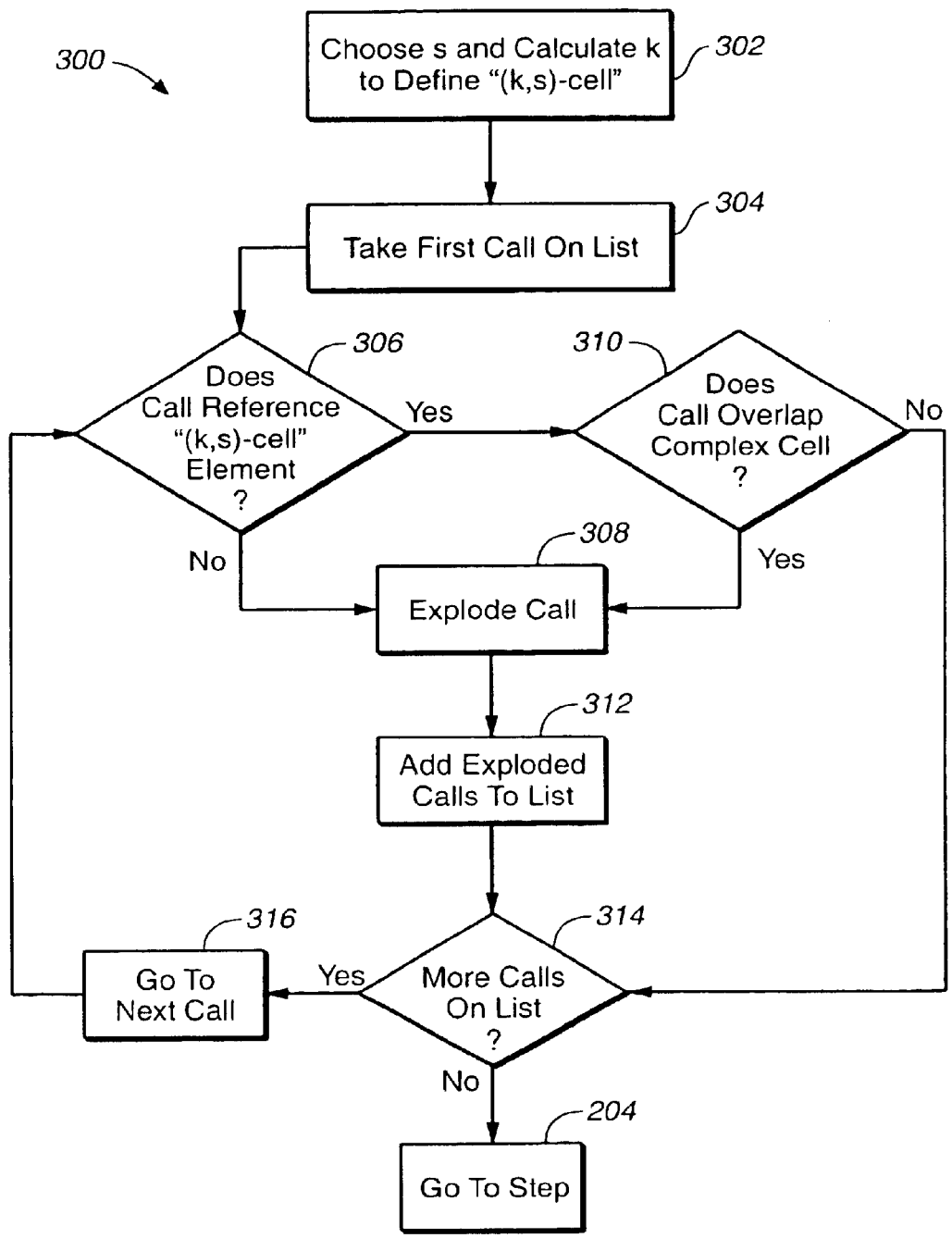
FIG._4

METHOD AND SYSTEM FOR CONSTRUCTING A HIERARCHY-DRIVEN CHIP COVERING FOR OPTICAL PROXIMITY CORRECTION

CROSS REFERENCE TO RELATED APPLICATION

This application is related to co-pending patent application Ser. No. 10/327,304, entitled "Method and System for Classifying an Integrated Circuit for Optical Proximity Correction," filed on the same day and assigned to the same Assignee as the present application.

FIELD OF THE INVENTION

The present invention relates to integrated circuit chip design, and more particularly to performing optical proximity correction on an integrated circuit design.

BACKGROUND OF THE INVENTION

The minimum feature sizes of integrated circuits (ICs) have been shrinking for years. Commensurate with this size reduction, various process limitations have made IC fabrication more difficult. One area of fabrication technology in which such limitations have appeared is photolithography. Photolithography Involves selectively exposing regions of a resist coated silicon wafer to a radiation pattern, and then developing the exposed resist in order to selectively protect regions of wafer layers.

An integral component of a photolithographic apparatus is a "reticle" which includes a pattern corresponding to features at one layer in an IC design. The reticle typically includes a transparent glass plate covered with a patterned light blocking material such as chromium. The reticle is placed between a radiation source producing radiation of a pre-selected wavelength and a focusing lens which may form part of a "stepper" apparatus. Placed beneath the stepper is a resist covered silicon wafer. When the radiation from the radiation source is directed onto the reticle, light passes through the glass (regions not having chromium patterns) and projects onto the resist covered silicon wafer. In this manner, an image of the reticle is transferred to the resist.

As light passes through the reticle, it is refracted and scattered by the chromium edges. This causes the projected image to exhibit some rounding and other optical distortion. While such effects pose relatively little difficulty in layouts with large feature sizes (e.g., layouts with critical dimensions above about 1 micron), they cannot be ignored in layouts having features smaller than about 1 micron. The problems become especially pronounced in IC designs having feature sizes near the wavelength of light used in the photolithographic process.

To remedy this problem, a reticle correction technique known as optical proximity correction (OPC) has been developed. Optical proximity correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result. Then the optical proximity correction is applied to compensate for the distortion. The resulting pattern is ultimately transferred to the reticle glass.

OPC, as now practiced, involves modifying a digital representation of a reticle design. The modification is performed by a computer such as workstation having appropriate software for performing OPC. Points separated by less than the critical dimension on the design are evaluated in sequence and corrected as necessary. Evaluation of each point requires analysis of surrounding features in two-dimensions to determine whether problematic diffraction effects are likely. If so, an appropriate correction (serif or segment removal, for example) is performed.

A problem with using OPC when performing a full mask design correction is that a substantial commitment must be made in terms of time and computing power in order to optically correct the integrated circuit design. For example, a moderately complex integrated circuit design may require at least a few days to correct with OPC even when the OPC algorithm runs on the fastest modern workstations.

The computational expense of OPC can be understood by recognizing that the correction often involves adding multiple small serifs to corners of design features and removing from, adding to, or displacing lateral sections of lines. The modifications are made only after evaluating an initial pattern with very fine granularity—typically evaluating potential correction points separated by no more than about 0.02 micrometers (using a 0.25 micron critical dimension technology). Note that a typical reticle design may include about 50–100 million "rectangles" of average size 0.5 by 0.5 micrometers. The features in and surrounding each rectangle must be evaluated in two dimensions. This process is very time consuming and requires significant computational resources because enormous amounts of data must be evaluated in order to perform OPC on a single IC chip.

Accordingly, what is needed is a system and method for efficiently and accurately performing OPC on an IC chip. The present invention addresses such a need.

SUMMARY OF THE INVENTION

The present invention provides a method and system for performing OPC on an IC chip. The system and method of the present invention includes exploding calls on an element list to generate an expanded element list, defining a local cover area for each call on the expanded element list, classifying congruent local cover areas into corresponding groups, and performing an OPC procedure for one local cover area in each group.

According to the method and system disclosed herein, by defining a local cover area for each element on the expanded element list and grouping congruent local cover areas, only one OPC procedure (e.g., evaluation and correction) needs to be performed per group of congruent local cover areas. The amount of data to be evaluated and the number of corrections performed is greatly reduced because OPC is not performed on repetitive portions of the IC chip design, thereby resulting in significant savings in computing resources and time.

BRIEF DESCRIPTION OF THE DRAWINGS

FIG. 1 is a block diagram illustrating an environment in which the present invention may operate.

FIG. 2 is a flowchart illustrating a process for performing OPC according to a preferred embodiment of the present invention.

FIG. 3 is a block diagram illustrating a local cover area according to a preferred embodiment of the present invention.

FIG. 4 is a flowchart illustrating a process for generating an expanded element list according to a preferred embodiment of the present invention.

DETAILED DESCRIPTION

The present invention relates to a method and system for performing OPC on an IC chip design. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiment shown but is to be accorded the widest scope consistent with the principles and features described herein.

As discussed above, OPC is a technique that corrects a mask design for potential light diffraction effects. In conventional systems, a mask design is fully created and is then corrected using an OPC technique. Some examples of OPC techniques are described in Otto, et al., Automate Optical Proximity Correction-A Rules-based Approach, SPIE Optical/Laser Microlithography VII, March 1994, and Helmsen et al. 3D Lithography Cases for Exploring Technology Solutions and Benchmarking Simulators, SPIE: Optical/Laser Microlithography VI, pp. 382–394, March 1994, that are incorporated herein in their entirety. As stated above, performing OPC on the entire integrated circuit design requires substantial time and computational resources because large amounts of data corresponding to millions of minute features in the mask design must be evaluated and corrected.

The method and system of the present invention is directed to reducing the amount of data evaluated for OPC. An IC chip design typically is made up of a number of elements or building blocks, which are repeated throughout the chip. These building blocks are hierarchical and referred to as cells, macrocells, or cores, depending on the hierarchical position of the element. For instance, a cell might represent a simple flipflop or SRAM circuit, while a macrocell might represent a more complex element (e.g., a large adder), which incorporates several cells. The lowest level building blocks are single polygons, also called features.

While an IC chip typically includes millions of features, it generally includes a relatively small number of cells. Because cells are repeatedly utilized throughout the IC chip design, congruent (i.e., same or similar) feature arrangements are inherent.

According to the present invention, the IC chip design is broken down into a plurality of local cover areas, each of which is formed around a cell making up the IC chip design. Congruent, i.e., substantially similar, local cover areas on the IC chip design are identified, classified, and grouped. By grouping congruent local cover areas, the data from only one representative local cover area in a group needs to be evaluated and corrected. This greatly reduces the amount of data evaluated for OPC, which in turn, saves time and computing resources. The resulting correction is applicable to all the local cover areas in that group.

The present invention is implemented as a software program, which in a preferred embodiment, operates on an engineering workstation or other type of computer system 12, as shown in FIG. 1. Referring now to FIG. 1, a block diagram illustrating an environment in which the present invention may operate is shown. Workstation 12 includes a microprocessor 14 that is coupled to a non-volatile storage device 16, e.g., a conventional hard disk storage device. The microprocessor 14 and the hard disk storage device 16 are coupled to a volatile storage device 110, e.g., a random access memory (RAM). A monitor 112, is coupled to the workstation 12 for displaying a user interface.

The RAM 110 stores, during operation, an operating system (O/S) 114, e.g., UNIX, a conventional input/output (I/O) module 116, an IC chip design 118, an optical proximity correction (OPC) module 120, and an OPC classification module 122. The IC chip design 118 is submitted by a designer (not shown) via the input/output (I/O) module 116. Preferably, the IC chip design 118 is described in some format, e.g., GDS II, which allows the OPC classification module 122 to interpret the design. The OPC classification module 122 communicates with the OPC module 120, and in accordance with the present invention, classifies and submits data from IC chip design 118 to the OPC module 120 for correction.

As stated above, the IC chip design 118 is represented in a format that allows the OPC classification module 122 and OPC module 120 to understand the design. Typically, the format is a text-based graphics language (TGL), such as GDS II, which describes the IC chip design 118 hierarchically. For example, the design 118 can have a root level, various intermediate levels, and leaf levels. The root level may be the entire IC chip design 118 or high level functional blocks within the design 118, e.g., a core or macrocell, and the leaf levels may include specific circuits and/or features.

Each design element (e.g., feature, cell, macrocell or core) is assigned a name or call. Accordingly, following the hierarchical nature of the design description, a high level element (e.g., a macrocell) can be described by its call, or by a list of calls that represent the lower level elements (e.g., cells and features) from which the high level element is composed. The lower level elements will be referred to as "sub-elements."

The act of expanding a call (for an element) into its subordinate calls (for the element's sub-elements) is referred to as "exploding" the call. After each explosion, the complexity of the original element decreases. In other words, $$\text{Complexity }(C) > \Sigma_{Ci} \text{ Complexity }(C_i)$$

where C refers to the original element, and $C_i$ refers to the different sub-elements described in C's call list after it has been exploded.

A simplicity factor, s, can be defined as the ratio between the complexity of C and the summation of the complexities of its different sub-elements, $C_i$. In other words, $$(\text{Complexity }(C)/(\Sigma_{Ci} \text{ Complexity }(C_i))) = s$$

where the simplicity factor, s, indicates how many more times simpler the original element has become after it has been exploded. The simplicity factor, s, increases each time C's call list is exploded because the number of new distinct sub-elements necessarily decreases as the number of explosions increases. In other words, after an element has been exploded a certain number of times, it becomes apparent that the same sub-elements are used repeatedly, but in different combinations, to compose the higher level element. This, in combination with the fact that sub-elements by their nature are generally less complex than the element itself, accounts for the increasing simplicity factor.

The following example illustrates this point. Consider a memory cell that, unexploded, has five (5) calls (see Table 1). Suppose the sum of complexities of all the cells in those five (5) calls is 3,981,870. If the five (5) calls are exploded once, 2,873 calls will result and the sum of complexities of all different cells in those calls will be 3,979,016. Thus, after one (1) explosion, i.e., k=1, the simplicity factor will be slightly greater than one (1), indicating that, after one explosion, the memory cell's complexity will only be slightly less complex.

Nevertheless, if the five (5) original calls are exploded five (5) times, i.e., k=5, the number of calls will increase to 154,637. While the number of calls has increased dramatically, the corresponding sum of complexities is only 28,031. This reflects the fact that many of the 154,637 calls are repetitive because the sum of complexities is that of all the different cells in the list. At this level, the memory cell is described by a relatively small number of sub-elements that are repeatedly utilized in various configurations. The simplicity factor, s, will be 142; meaning, the memory cell exploded five (5) times will be 142 times more simple than the unexploded memory cell.

TABLE 1

| k (no. of times exploded) | Number of calls | Complexity |
|---|---|---|
| 0 | 5 | 3,981,870 |
| 1 | 2873 | 3,979,016 |
| 2 | 2927 | 3,974,071 |
| 3 | 3130 | 3,973,844 |
| 4 | 5771 | 3,783,431 |
| 5 | 154,637 | 28,031 |
| 6 | 247,415 | 11,978 |
| 7 | 353,641 | 1258 |
| 8 | 1,534,513 | 1138 |
| 9 | 3,912,241 | 580 |
| 10 | 3,981,873 | 442 |

The simplicity factor, s, determines the minimum number of times, k, the calls describing an element or cell must be exploded. Any element or cell that becomes at least s times simpler after it has been exploded k times is referred to as a "(k,s)-cell." Thus, for example, the memory cell represented in Table 1, could be characterized as "(5, 100)-cell," as well as a "(7, 1000)-cell."

According to a preferred embodiment of the present invention, some calls on the element list 128 for the IC chip design 118 are exploded to a point where the resulting sum of the complexities of the different elements, $C_i$, is significantly lower compared to the complexity of the unexploded design. In a preferred embodiment, the element list 128 is exploded to achieve a simplicity factor, s, between 50 and 100. At this level, the IC chip design 118 has been broken down into a number of repetitive elements, which can be grouped and corrected efficiently and accurately.

FIG. 2 is a flowchart illustrating a process 200 for performing OPC according to a preferred embodiment of the present invention. Referring to FIGS. 1 and 2, the process begins in step 202 when the OPC classification module 122 explodes calls on an element list 128 for an IC chip design 118 to generate an expanded element list 124. In a preferred embodiment, a call on the element list 128 is exploded if the complexity of the element (referenced by the call) meets or exceeds a predefined criteria. The process for generating the expanded element list 124 will be described below.

After the element list 128 has been exploded, the OPC classification module 122 defines a local cover area (LCA) in step 204 for each call on the expanded element list 124. FIG. 3 is a diagram illustrating a schematic representation of an LCA 100 according to a preferred embodiment of the present invention. As is shown, the LCA 100 for an element 102 includes an area 104 framing the element 102, wherein the features within the framed area 104 will be corrected. The framed element 102 is referred to as the "root," and the framed area 104 is referred to as the "Area where Mask is Valid," or AMV. In addition to the AMV 104, the LCA 100 also includes an area surrounding the AMV 104 corresponding to a radius of optical influence 106. All elements falling within the radius of optical influence 106 can affect, or be affected by, the correction procedure performed in the AMV 104. Thus, the LCA 100 comprises a call list referencing the root 102 and all of the neighboring elements 108 intersecting the LCA 100. The LCA 100 contains all of the information needed to solve the OPC problem in the AMV 104.

Referring back to FIG. 2, once an LCA 100 is defined for each call on the expanded element list 124, the OPC classification module 122 compares each of the LCAs 100 with all of the other LCAs 100 in step 206, and consolidates substantially similar, i.e., congruent, LCAs 100 into groups, in step 208. Determining which LCAs 100 are different is fast and simple because calls and their configurations are easily compared. In addition, the amount of information analyzed is much less compared to an approach where flat, nonstructured, and nameless geometry is compared.

After consolidation (step 208), the OPC classification module 122 generates a cell list 126 (step 210) that contains one LCA 100 from each of the various groups. In step 212, the classification module 122 then transmits the cell list 126 to the OPC module 120 for correction. Because the OPC module 120 performs an OPC procedure for each different type of LCA 100, as opposed to performing a procedure for every LCA 100, the amount of data to evaluate and the amount of time to correct the IC chip design is significantly reduced.

As stated above, the expanded element list 124 is generated by exploding calls on the element list 128. In a preferred embodiment, a call on the element list 128 is exploded only if it meets or exceeds certain criteria.

FIG. 4 is a flowchart illustrating a process 300 for generating the expanded element list 124 according to the preferred embodiment of the present invention. The process begins, in step 302, by choosing a simplicity factor, s, and calculating k, i.e., the number of times the element list 128 for the IC chip design 118 must be exploded in order to achieve s. As stated above, s is preferably in a range between 50 and 100. Once k has been calculated, the IC chip design is characterized as a "(k,s)-cell."

Next, the OPC classification module 122 considers the first call on the element list 128 in step 304, and determines whether the element referenced by the call is characterized as the "(k,s)-cell", in step 306. If the element is not a "(k,s)-cell," then the classification module 122 explodes the call in step 308, and the exploded calls are added to the element list 128 in step 312. Next, the OPC classification module 122 determines whether more calls are on the element list 128 in step 314. If more calls exist, the OPC classification module 122 considers the next call in the element list 128 in step 316, and repeats steps 306–316. If the element referenced by the call is a "(k,s)-cell," the classification module 122 then determines whether the call overlaps one or more large or complex cells in step 310.

If the call overlaps, the classification module 122 explodes the call (step 308), adds the exploded calls to the element list 128 (step 312), and performs the steps described above. If the call does not overlap, the OPC classification module 122 determines whether more calls are on the element list 128 (step 314). If more calls exist, the OPC classification module 122 considers the next call in the element list 128 (step 316), and repeats steps 306–316.

The expanded element list 124 is generated after the OPC classification module 122 has considered all of the calls on the element list 128, including the additional calls generated from the explosions. Preferably, the expanded element list 124 includes calls that reference elements that are characterized as a "(k,s)-cell."

A method and system for classifying an IC chip by congruent local cover areas for performing OPC correction has been disclosed. By exploding an element list 128 of an IC chip design 118, and identifying and grouping congruent local cover areas, only one OPC procedure (e.g., evaluation and correction) needs to be performed per group of congruent local cover areas. The amount of data to be evaluated and the number of corrections performed is greatly reduced because OPC is not performed on repetitive portions of the IC chip design, thereby resulting in significant savings in computing resources and time.

Moreover, because each local cover area 100 includes all of the information needed to solve the OPC problem in its AMV 104, each local cover area 100 can be treated as a separate "sub-IC circuit design." The element list 128 for the local cover area 100 can be exploded and a cell list 126 can be generated for the local cover area 100. This process can be repeated until the local cover area 100 is small enough to be solved with a fourier-based OPC corrector, as is well known to those skilled in the art.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for performing optical proximity correction (OPC) on an integrated circuit (IC) chip design, wherein the IC chip design comprises an element list and each element on the element list is assigned a call name, the method comprising the steps of:
   (a) exploding a plurality of calls on the element list to generate an expanded element list;
   (b) defining a local cover area for each call on the expanded element list;
   (c) classifying congruent local cover areas into corresponding groups; and
   (d) performing an OPC procedure for one local cover area in each group.

2. The method of claim 1, wherein each element is comprised of one or more sub-elements, and wherein the exploding step (a) further includes:
   (a1) replacing the call of the element with the one or more calls of the sub-elements.

3. The method of claim 1, wherein exploding step (a) further includes:
   (a1) determining whether an element is characterized as a (k,s)-cell, wherein the (k,s)-cell is an element that is s times simpler after its element list has been exploded k times; and
   (a2) exploding the call of the element if such a reference is not made.

4. The method of claim 3, wherein exploding step (a) further includes:
   (a3) if the element is characterized as the (k,s)-cell, exploding the call of the element if the element overlaps a complex cell; and
   (a4) repeating steps (a1) through (a3) for a next call on the element list until all calls have been analyzed.

5. The method of claim 1, wherein the defining step (b) further includes:
   (b1) for each call on the expanded element list, identifying all neighboring calls for elements falling within an area surrounding the element.

6. The method of claim 5, wherein the area surrounding the element is defined by a radius of optical influence.

7. The method of claim 1, wherein the classifying step (c) further includes:
   (c1) comparing each local cover area to all other local cover areas.

8. The method of claim 1, further comprising the step of:
   e) selecting one local cover area from each group; and
   f) placing each selected local cover area on a cell list after the classifying step (c).

9. The method of claim 8, wherein the performing step (d) further includes:
   (d1) performing OPC on the local cover areas on the cell list.

10. A computer readable medium containing programming instructions for performing optical proximity correction (OPC) on an integrated circuit (IC) chip design, wherein the IC chip design comprises an element list and each element on the element list is assigned a call name, the method comprising the steps of:
    (a) exploding a plurality of calls on the element list to generate an expanded element list;
    (b) defining a local cover area for each call on the expanded element list;
    (c) classifying congruent local cover areas into corresponding groups; and
    (d) performing an OPC procedure for one local cover area in each group.

11. The computer readable medium of claim 10, wherein each element is comprised of one or more sub-elements, and wherein the exploding instruction (a) further includes:
    (a1) replacing the call of the element with the one or more calls of the sub-elements.

12. The computer readable medium of claim 10, wherein exploding instruction (a) further includes:
    (a1) determining whether an element is characterized as a (k,s)-cell, wherein the (k,s)-cell is an element that is s times simpler after its element list has been exploded k times; and
    (a2) exploding the call of the element if such a reference is not made.

13. The computer readable medium of claim 12, wherein exploding instruction (a) further includes:
    (a3) if the element is characterized as the (k,s)-cell, exploding the call of the element if the element overlaps a complex cell; and
    (a4) repeating steps (a1) through (a3) for a next call on the element list until all calls have been analyzed.

14. The computer readable medium of claim 10, wherein the defining instruction (b) father includes:
    (b1) for each call on the expanded element list, identifying all neighboring calls for elements falling within an area surrounding the element.

15. The computer readable medium of claim 14, wherein the area surrounding the element is defined by a radius of optical influence.

16. The computer readable medium of claim 10, wherein the classifying instruction (c) further includes:
    (c1) comparing each local cover area to all other local cover areas.

17. The computer readable medium of claim 10, further comprising the instructions for:
    e) selecting one local cover area from each group; and
    f) placing each selected local cover area on a cell list after the classifying step (c).

18. The computer readable medium of claim 17, wherein the performing instruction (d) further includes:
(d1) performing OPC on the local cover areas on the cell list.

19. A computer based system for performing optical proximity correction on an integrated circuit ("IC") chip design, wherein the IC chip design comprises an element list and each element on the element list is assigned a call name, the system comprising:
a microprocessor;
a classification module coupled to the microprocessor for exploding a plurality of calls on the element list to generate an expanded element list, defining a local cover area for each call on the expanded element list, and classifying congruent local cover areas into corresponding groups; and
an optical proximity correction module coupled to the classification module for performing optical proximity correction for one local cover area in each group.

20. The system of claim 19, wherein the classification module generates the expanded element list by replacing the call of an element with the calls of its sub-elements.

21. The system of claim 19, wherein the classification module defines the local cover area for a call by identifying calls of all neighboring elements within a radius of optical influence surrounding the element.

22. The system of claim 19, wherein the classification module further selects one local cover area from each group to form a cell list, and transmits the cell list to the optical proximity correction module for correction.

23. A method for performing optical proximity correction (OPC) on an integrated circuit (IC) chip design, wherein the IC chip design comprises an element list and each element on the element list is assigned a call name, the method comprising the steps of:
(a) exploding a plurality of calls on the element list to generate an expanded element list, wherein exploding step (a) further includes:
(a1) determining whether an element is characterized as a (k,s)-cell, wherein the (k,s)-cell is an element that is s times simpler after its element list has been exploded k times;
(a2) exploding the call of the element if such a reference is not made;
(a3) if the element is characterized as the (k,s)-cell, exploding the call of the element if the element overlaps a complex cell; and
(a4) repeating steps (a1) through (a3) for a next call on the element list until all calls have been analyzed;
(b) defining a local cover area for each call on the expanded element list;
(c) classifying congruent local cover areas into corresponding groups; and
(d) performing an OPC procedure for one local cover area in each group.

24. A computer readable medium containing programming instructions for performing optical proximity correction (OPC) on an integrated circuit (IC) chip design, wherein the IC chip design comprises an element list and each element on the element list is assigned a call name, the method comprising the steps of:
(a) exploding a plurality of calls on the element list to generate an expanded element list, wherein exploding step (a) further includes:
(a1) determining whether an element is characterized as a (k,s)-cell, wherein the (k,s)-cell is an element that is s times simpler after its element list has been exploded k times;
(a2) exploding the call of the element if such a reference is not made;
(a3) if the element is characterized as the (k,s)-cell, exploding the call of the element if the element overlaps a complex cell; and
(a4) repeating steps (a1) through (a3) for a next call on the element list until all calls have been analyzed;
(b) defining a local cover area for each call on the expanded element list;
(c) classifying congruent local cover areas into corresponding groups; and
(d) performing an OPC procedure for one local cover area in each group.

25. A computer based system for performing optical proximity correction on an integrated circuit ("IC") chip design, wherein the IC chip design comprises an element list and each element on the element list is assigned a call name, the system comprising:
a microprocessor;
a classification module coupled to the microprocessor for exploding a plurality of calls on the element list to generate an expanded element list, defining a local cover area for each call on the expanded element list, and classifying congruent local cover areas into corresponding groups; and
an optical proximity correction module coupled to the classification module for performing optical proximity correction for one local cover area in each group,
wherein the microprocessor determines whether an element is characterized as a (k,s)-cell, wherein the (k,s)-cell is an element that is s times simpler after its element list has been exploded k times, explodes the call of the element if such a reference is not made, if the element is characterized as the (k,s)-cell and if the element overlaps a complex cell, explodes the call of the element, and repeats steps (a1) through (a3) for a next call on the element list until all calls have been analyzed.

* * * * *